(12) United States Patent
Tsuchiya et al.

(10) Patent No.: US 6,585,568 B2
(45) Date of Patent: Jul. 1, 2003

(54) CHEMICAL MECHANICAL POLISHING SLURRY

(75) Inventors: Yasuaki Tsuchiya, Tokyo (JP); Tomoko Wake, Tokyo (JP); Tetsuyuki Itakura, Tokyo (JP); Shin Sakurai, Tokyo (JP); Kenichi Aoyagi, Tokyo (JP)

(73) Assignees: NEC Electronics Corporation (JP); Tokyo Magnetic Printing Co. Ltd (JP)

( * ) Notice: Subject to any disclaimer, the term of this patent is extended or adjusted under 35 U.S.C. 154(b) by 0 days.

(21) Appl. No.: 09/990,224

(22) Filed: Nov. 21, 2001

(65) Prior Publication Data

US 2002/0093002 A1 Jul. 18, 2002

(30) Foreign Application Priority Data

Nov. 24, 2000 (JP) ........................................ 2000-357798

(51) Int. Cl.$^7$ ................................................. B24B 1/00
(52) U.S. Cl. ........................... 451/36; 51/309; 438/692; 438/693
(58) Field of Search ................... 451/36, 41; 51/307, 51/308, 309; 156/345.11, 345.12; 438/690, 691, 692, 693

(56) References Cited

U.S. PATENT DOCUMENTS

| | | | |
|---|---|---|---|
| 6,197,690 B1 * | 3/2001 | Schonauer et al. | 438/691 |
| 6,242,351 B1 * | 6/2001 | Li et al. | 438/690 |
| 6,348,076 B1 * | 2/2002 | Canaperi et al. | 51/309 |
| 6,350,687 B1 * | 2/2002 | Avanzino et al. | 438/687 |
| 6,368,955 B1 * | 4/2002 | Easter et al. | 438/633 |

FOREIGN PATENT DOCUMENTS

| JP | 8-64594 | 3/1996 |
|---|---|---|
| JP | 8-83780 | 3/1996 |
| JP | 11-238709 | 8/1999 |

* cited by examiner

Primary Examiner—Eileen P. Morgan
(74) Attorney, Agent, or Firm—Dickstein, Shapiro, Morin & Oshinsky, LLP.

(57) ABSTRACT

This invention provides a chemical mechanical polishing slurry for polishing a copper-based metal film formed on an insulating film comprising a concave on a substrate, comprising a polishing material, an oxidizing agent and water as well as a benzotriazole compound and a triazole compound. The polishing slurry may be used in CMP to form a reliable damascene electric connection with excellent electric properties at a higher polishing rate, i.e., a higher throughput while preventing dishing.

8 Claims, 2 Drawing Sheets

CHEMICAL MECHANICAL POLISHING SLURRY

TECHNICAL FIELD

The present invention relates to a chemical mechanical polishing slurry. In particular, it relates to a chemical mechanical polishing slurry suitable as a polishing liquid used during forming a damascene copper interconnect in manufacturing a semiconductor device.

BACKGROUND OF THE INVENTION

With regard to forming a semiconductor integrated circuit such as ULSI which has been significantly refined and compacted recently, copper has been expected to be a useful material for electric connection because of its good electromigration resistance and lower electrical resistance.

To date a copper interconnect is as follows, due to problems such as difficulty in patterning by dry etching. Specifically, a concave such as a trench and a connection hole is formed in an insulating film, a barrier metal film is formed on the surface, a copper film is deposited by plating such that the concave is filled with the material, and then the surface is polished to be flat by chemical mechanical polishing (hereinafter, referred to as "CMP") until the surface of the insulating film except the concave area is completely exposed, to form electric connections such as a damascene interconnect in which the concave is filled with copper, a via plug and a contact plug.

There will be described a process for forming a damascene copper interconnect with reference to FIG. 1.

On a silicon substrate on which a semiconductor device has been formed (not shown) is formed a lower interconnect layer 1 consisting of an insulating film comprising a lower interconnect (not shown). Then, as shown in FIG. 1(a), on the silicon substrate are sequentially formed a silicon nitride film 2 and a silicon oxide film 3. On the silicon oxide film 3 is formed a concave having an interconnect pattern and reaching the silicon nitride film 2.

Then, as shown in FIG. 1(b), a barrier metal film 4 is formed by sputtering. On the film is formed a copper film 5 over all the surface by plating such that the concave is filled with the material.

As shown in FIG. 1(c), the copper film 5 is polished by CMP to make the substrate surface flat. Polishing by CMP is continued until the metal over the silicon oxide film 3 is completely removed, as shown in FIG. 1(d).

In the above process for forming a damascene copper interconnect, a barrier metal film made of, for example, a tantalum-based metal such as Ta and TaN is formed as a base film for, e.g., preventing diffusion of a copper-based metal into the insulating film. However, when simultaneously polishing such different materials, a polishing rate for the barrier metal film is significantly smaller than that for the copper-based metal film. Specifically, when forming a damascene copper interconnect by CMP using a conventional polishing slurry, there is a significant difference between the polishing rates for the copper-based metal film and the barrier metal film, which may cause dishing and erosion.

Dishing is a phenomenon that the copper-based metal film in the concave is excessively polished so that the center of the copper-based metal film in the concave is depressed in relation to the plane of the insulating film on the substrate, as shown in FIG. 2. More polishing time is required for completely removing the barrier metal film 4 on the insulating film (silicon oxide film 3) because of a lower polishing rate for the barrier metal film. The polishing rate for the copper-based metal film is, however, higher than that for the barrier metal film, so that the copper-based metal film is excessively polished, resulting in dishing.

Erosion is a phenomenon that polishing in a dense interconnect area excessively proceeds in relation to that in a sparse area such as an isolated interconnect area so that the surface of the dense interconnect area becomes depressed in relation to the other surfaces, as shown in FIG. 1(d). When the dense interconnect area comprising many damascenes in the copper film 5 is considerably separated from the isolated interconnect area comprising less damascenes in the copper film 5 by, for example, an area without interconnects within the wafer, and the copper film 5 is polished faster than the barrier metal film 4 or the silicon oxide film 3 (insulating film), then a polishing pad pressure to the barrier metal film 4 or the silicon oxide film 3 in the dense interconnect area becomes higher than that in the isolated interconnect area. As a result, in the CMP process after exposing the barrier metal film 4 (the process of FIG. 1(c) and thereafter), there generates a difference in a polishing rate by CMP between the dense interconnect area and the isolated interconnect area, so that the insulating film in the dense interconnect area is excessively polished, resulting in erosion.

Dishing in the process for forming an electric connection in a semiconductor device as described above, may cause increase in an interconnection resistance and a connection resistance, and tends to cause electromigration, leading to poor reliability in the device. Erosion may adversely affect flatness in the substrate surface, which becomes more prominent in a multilayer structure, causing problems such as increase and dispersion in an interconnect resistance.

It is well-known that benzotriazole or its derivative or 1,2,4-triazole may be added to a polishing slurry for preventing the above problems, in particular dishing formation.

JP-A 8-83780 has disclosed that a polishing slurry comprising benzotriazole or its derivative may be used for preventing dishing during chemical mechanical polishing in forming a damascene interconnect made of copper or a copper alloy. Benzotriazole may act as a protective film preventing oxidation or corrosion in the presence of an etchant having a chemical etching range where copper can be quickly etched. There has been described that a polishing slurry comprising benzotriazole together with an etchant may be used in chemical mechanical polishing so that a reliable conductor film can be quickly formed while preventing dishing or scratches.

JP-A 11-238709 has described that a slurry for chemical mechanical polishing may comprise a triazole derivative such as a 1,2,4-triazole or benzotriazole derivative for improving flatness in copper polishing.

JP-A 8-64594 has disclosed, without describing prevention of dishing, a grain liquid comprising benzotriazole for improving reliability in a semiconductor device by preventing a metal-film interconnect containing copper from being deteriorated due to corrosion during polishing. There has been described that a polishing liquid comprising benzotriazole may be used in polishing to form an anticorrosive film before corrosion so that an interconnect can be reliably formed while preventing corrosion.

As described above, dishing can be inhibited while preventing corrosion, by using a polishing slurry comprising benzotriazole in chemical mechanical polishing. However, as a content of benzotriazole is increased, a polishing rate of copper is reduced, leading to reduction in a throughput. It has been, therefore, difficult to conduct polishing at a higher polishing rate while adequately inhibiting dishing.

An excessive content of benzotriazole tends to cause vibration or vibration noise during polishing a copper film (FIGS. 1(b) to (c)), and in a polishing process where a barrier metal film and/or interlayer insulating film is exposed (FIGS. 1(c) to (d)), an interconnect end may be often damaged from a barrier metal film.

SUMMARY OF THE INVENTION

An objective of this invention is to provide a chemical mechanical polishing slurry whereby polishing can be conducted at a higher polishing rate while preventing dishing in chemical mechanical polishing of a copper-based metal film formed on an insulating film comprising a concave on a substrate and to form a reliable damascene electric connection with excellent electric properties.

This invention relates to a chemical mechanical polishing slurry for polishing a copper-based metal film formed on an insulating film comprising a concave on a substrate, comprising a polishing material, an oxidizing agent and water as well as a benzotriazole compound and a triazole compound.

A chemical mechanical polishing slurry of this invention (hereinafter, referred to as a "polishing slurry") may be suitably used in polishing a copper-based metal (copper or a copper alloy comprising copper as a main component) film formed on an insulating film with a concave on a substrate by CMP.

The slurry may be effectively used in a process for forming a barrier metal film as a base film on an insulating film with a concave; forming a conductive metal film on the barrier metal film such that the concave is filled with the metal film; and polishing by CMP the substrate to flatten the substrate surface until the barrier metal film or the insulating film is exposed so that an electric connection such as a damascene interconnect where the concave is filled with a copper-based metal, a plug and a contact is formed. The slurry is more effective when the barrier metal is a tantalum-based metal.

A polishing slurry of this invention may be used in CMP to form a reliable damascene electric connection with excellent electric properties at a higher polishing rate, i.e., a higher throughput while preventing dishing.

DETAILED DESCRIPTION OF THE EMBODIMENTS

Figure 1:
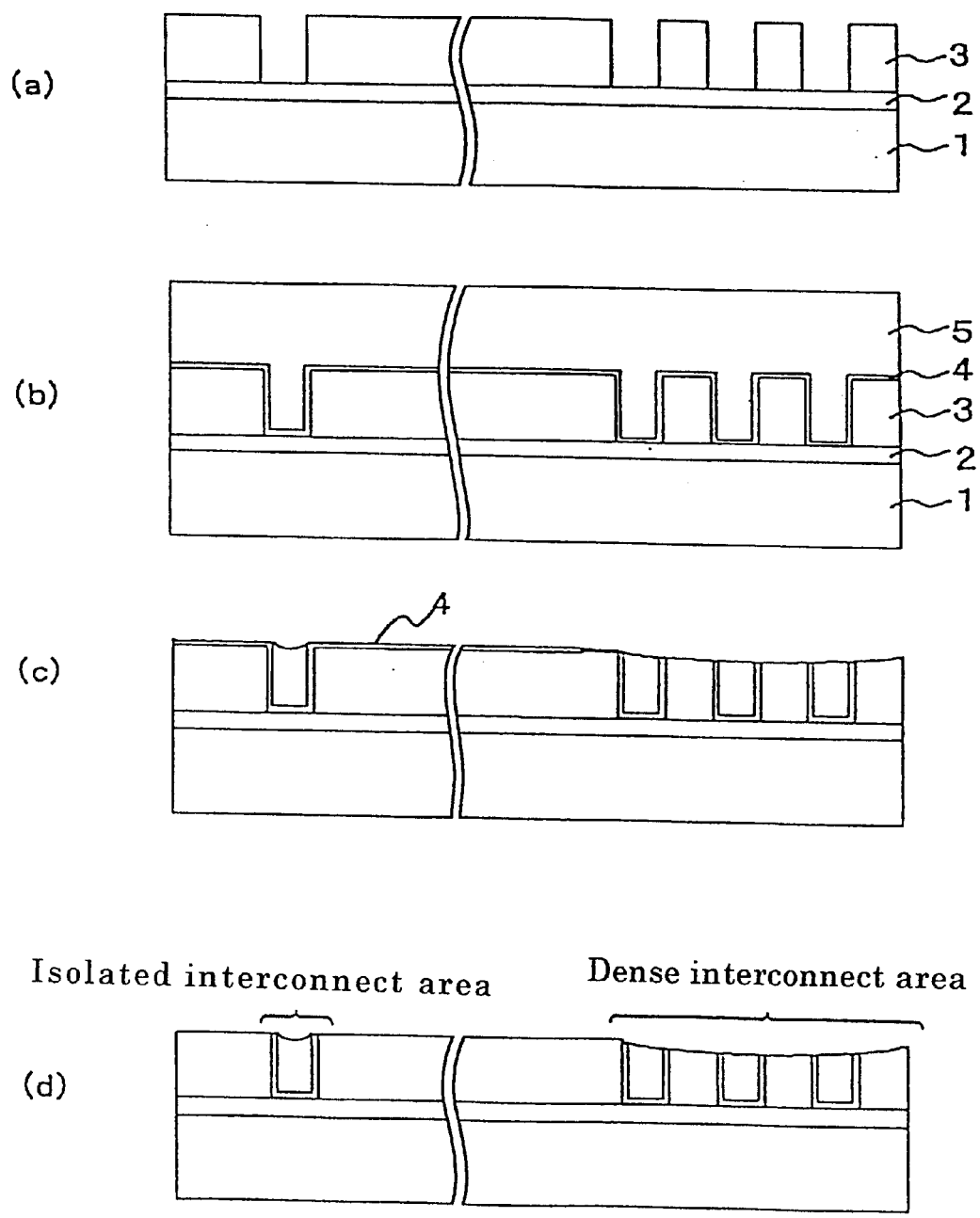
FIG. 1 is a process cross section illustrating a conventional process for forming a damascene copper interconnect.
Figure 2:
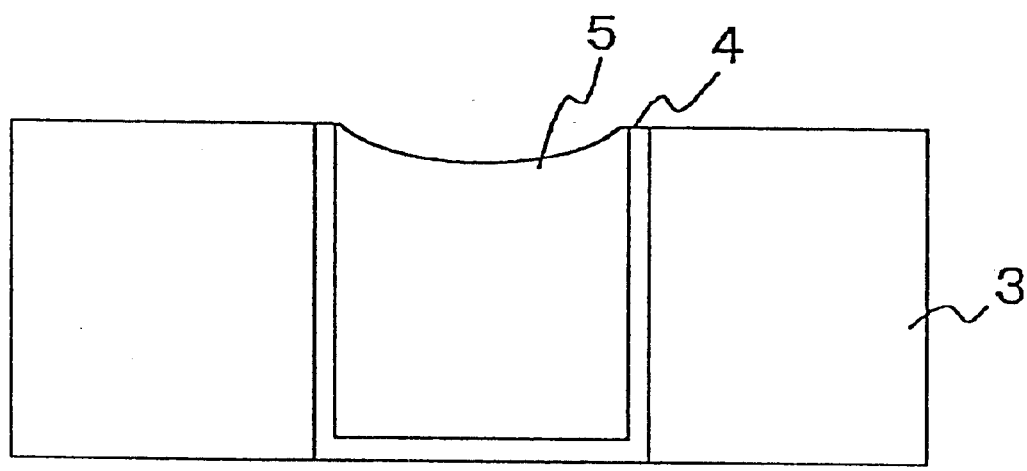
FIG. 2 schematically shows a cross-sectional shape of an interconnect when a damascene copper interconnect is formed using a conventional chemical mechanical polishing slurry.

Preferable embodiments of this invention will be described.

A polishing slurry of this invention comprises a polishing material, an oxidizing agent and water as well as a benzotriazole compound and a triazole compound. It is preferable to add a proton donor as an oxidation aid for promoting oxidation of a copper-based metal film by the oxidizing agent and achieving stable polishing.

A benzotriazole compound may be benzotriazole or its derivative represented by general formula (1) and may be a mixture of two or more thereof.

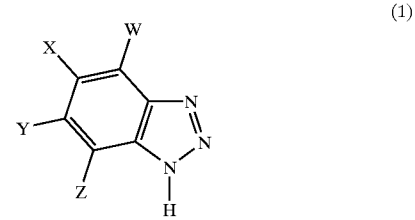

(1)

In general formula (1), each of X, Y, Z and W independently represents hydrogen; hydroxy; alkoxy such as methoxy and ethoxy; amino; nitro; alkyl such as methyl, ethyl and butyl; and halogen such as fluorine, chlorine, bromine and iodine.

A triazole compound may be triazole or its derivative and may be a mixture of two or more thereof.

Triazole or its derivative may be 1,2,4-triazole or its derivative represented by general formula (2) or 1,2,3-triazole or its derivative represented by general formula (3), preferably 1,2,4-triazole or its derivative.

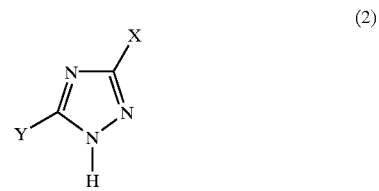

(2)

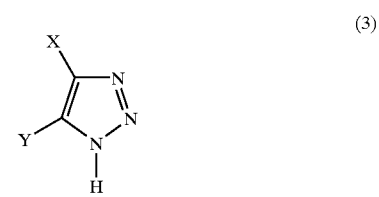

(3)

In general formula (2) or (3), each of X and Y independently represents hydrogen; hydroxy; alkoxy such as methoxy and ethoxy; amino; nitro; alkyl such as methyl, ethyl and butyl; and halogen such as fluorine, chlorine, bromine and iodine.

A total content of a benzotriazole compound and a triazole compound is preferably 0.01 wt % or more to the total amount of a polishing slurry for adequately preventing dishing while being preferably 1 wt % or less for achieving a desired polishing rate. If a total content of the benzotriazole compound and the triazole compound is too small, dishing may not be inhibited to a desired level while if too large, a desired polishing rate may not be achieved.

In terms of a mixing ratio of a benzotriazole compound and a triazole compound, a mixing ratio of a triazole compound to a benzotriazole compound (triazole compound/benzotriazole compound) is preferably 1 or more, more preferably 5 or more while being preferably 100 or less, more preferably 70 or less, for achieving an adequate polishing rate and adequately inhibiting dishing. If the above mixing ratio is too small (i.e., a benzotriazole compound is excessive), a polishing rate may be reduced to less than a desired level while if too large (i.e., a benzotriazole compound is deficient), dishing may be not be sufficiently inhibited for achieving a desired level of flatness.

Although the above benzotriazole compounds or triazole compounds may also act as an antioxidant, another antioxidant may be appropriately added as long as the latter may not adversely affect an effect of adding the former. Examples of such an antioxidant include benzofuroxane, 2,1,3-benzothiazole, o-phenylenediamine, m-phenylenediamine, catechol, o-aminophenol, 2-mercaptobenzothiazole, 2-mercaptobenzimidazole, 2-mercaptobenzoxazole, melamine and their derivatives.

Examples of a polishing material which may be used in this invention include alumina such as $\alpha$-alumina and $\theta$-alumina; silica such as fumed silica and colloidal silica; titania; zirconia; germania; ceria; and a combination of two or more selected from these metal oxide polishing grains. Among these, alumina or silica is preferable.

An average particle size of a polishing material is preferably 5 nm or more, more preferably 10 nm or more and preferably 500 nm or less, more preferably 300 nm or less, as determined by light scattering diffraction in the light of, for example, a polishing rate, dispersion stability and surface roughness of a polished surface.

A content of a polishing material in a polishing slurry may be appropriately selected within a range of 0.1 to 50 wt % to the total amount of the polishing slurry in the light of various factors such as a polishing efficiency and polishing accuracy. It is preferably 1 wt % to 10 wt % both inclusive.

An oxidizing agent used in this invention may be appropriately selected from water-soluble oxidizing agents in the light of various factors such as polishing accuracy and a polishing efficiency. For example, those which may not cause heavy-metal ion contamination include peroxides such as $H_2O_2$, $Na_2O_2$, $Ba_2O_2$ and $(C_6H_5C)_2O_2$; hypochlorous acid (HClO); perchloric acid; nitric acid; ozone water; and organic acid peroxides such as peracetic acid and nitrobenzene. Among these, hydrogen peroxide ($H_2O_2$) is preferable because it does not contain a metal component and does not generate a harmful byproduct.

A content of the oxidizing agent is preferably at least 0.01 wt %, more preferably at least 0.05 wt %, further preferably at least 0.1 wt % for achieving adequate effects of its addition while it is preferably 15 wt % or less, more preferably 10 wt % or less for preventing dishing and adjusting a polishing rate to a proper value. When using an oxidizing agent which is relatively susceptible to deterioration with age such as hydrogen peroxide, it may be possible to separately prepare a solution containing an oxidizing agent at a given concentration and a composition which provides a given polishing slurry after addition of the solution containing an oxidizing agent, which are then combined just before use.

A proton donor (oxidation aid) added for promoting oxidation by an oxidizing agent in a polishing slurry or for stable polishing may include known organic acids such as known carboxylic acids and amino acids.

Examples of a carboxylic acid include oxalic acid, malonic acid, tartaric acid, malic acid, glutaric acid, citric acid, maleic acid, formic acid, acetic acid, propionic acid, butyric acid, valeric acid, acrylic acid, lactic acid, succinic acid, nicotinic acid and their salts.

An amino acid may be added as such, as a acid, as a salt or as a hydrate. Examples of those which may be added include arginine, arginine hydrochloride, arginine picrate, arginine flavianate, lysine, lysine hydrochloride, lysine dihydrochloride, lysine picrate, histidine, histidine hydrochloride, histidine dihydrochloride, glutamic acid, glutamic acid hydrochloride, sodium glutaminate monohydrate, glutamine, glutathione, glycylglycine, alanine, $\beta$-alanine, $\gamma$-aminobutyric acid, $\epsilon$-aminocaproic acid, aspartic acid, aspartic acid monohydrate, potassium aspartate, potassium aspartate trihydrate, tryptophan, threonine, glycine, cystine, cysteine, cysteine hydrochloride monohydrate, oxyproline, isoleucine, leucine, methionine, ornithine hydrochloride, phenylalanine, phenylglycine, proline, serine, tyrosine and valine.

The above organic acids such as carboxylic acids and amino acids may be a mixture of different two or more thereof.

A content of an organic acid in a polishing slurry is preferably at least 0.01 wt %, more preferably at least 0.05 wt % to the total amount of the polishing slurry for achieving adequate effect of its addition as a proton donor, while it is preferably 5 wt % or less, more preferably 3 wt % or less for preventing dishing and adjusting a polishing rate to a proper value. When combining two or more organic acids, the above content refers to the sum of the individual organic acids.

For a polishing slurry of this invention, pH is preferably 3 or more, more preferably 4 or more while being preferably 9 or less, more preferably 8 or less in the light of a polishing rate, corrosion, a slurry viscosity and dispersion stability of a polishing material. A known procedure may be used to adjust pH of a polishing slurry, using an alkali such as alkali metal hydroxides such as sodium hydroxide and potassium hydroxide; alkali metal carbonates such as sodium carbonate and potassium carbonate; ammonia; and amines.

A polishing slurry of this invention may contain a variety of additives such as dispersing agents and buffers commonly added to a polishing slurry as long as it does not deteriorate the properties of the slurry.

A composition ratio of a polishing slurry of this invention is preferably adjusted such that a polishing rate for a metal film by CMP becomes preferably at least 400 nm/min, more preferably at least 500 nm/min. A composition ratio is preferably adjusted such that the polishing rate becomes preferably 1500 nm/min or less, more preferably 1000 nm/min or less in the light of polishing accuracy and prevention of dishing.

A polishing slurry of this invention may be prepared by a common process for preparing a free-grain aqueous polishing slurry composition. Specifically, to an aqueous solvent are added a proper amount of polishing grain (polishing material particles) and, if necessary, a proper amount of a dispersing agent. In such a state, the grains are aggregated. Thus, the aggregated polishing material particles are dispersed into particles with a desired particle size by conducting dispersion of the polishing grain mixture. In such a dispersion process, an appropriate apparatus may be used, including an ultrasonic disperser, a bead mill, a kneader and a ball mill.

CMP using a polishing slurry of this invention may be conducted, using, for example a procedure described below. First, a substrate is prepared, on which an insulating film is formed, a concave with a given pattern is formed on the insulating film and a copper-based metal film is deposited on the concave. The substrate is placed on a wafer carrier such as a spindle. The copper-based metal film surface of the substrate is contacted with a polishing pad attached on a surface plate such as a rotary plate under a given pressure. While supplying a polishing slurry between the substrate and the polishing pad, polishing is initiated by relatively moving the substrate (wafer) and the polishing pad (e.g., rotating both). The polishing slurry may be supplied on the polishing pad from a separate supply pipe or from the surface plate side. If necessary, a pad conditioner is contacted with the surface of the polishing pad to condition the surface of the polishing pad.

A polishing slurry of this invention described above may be most effectively used when polishing by CMP is conducted to a substrate in which a barrier metal film is deposited on an insulating film comprising a concave such as a trench and a connection hole and a copper-based metal film is formed over the whole surface while filling the concave with the metal, to form an electric connection such as a damascene interconnect, a via plug and a contact plug. Examples of an insulating film include a silicon oxide film, a BPSG film and an SOG film. Examples of a barrier metal film suitable for a copper-based metal film (a film made of copper or a copper alloy comprising copper as a main component) include those made of a tantalum-based metal such as tantalum (Ta), tantalum nitride and tantalum nitride silicon.

EXAMPLE

This invention will be more specifically described with reference to Examples.

Substrate to be Polished

A substrate to be polished where a metal film is formed on an insulating film comprising a concave was prepared as described below. On a 6 inch wafer (silicon substrate) in which a semiconductor device such as a transistor was formed was deposited a lower interconnect layer made of a silicon oxide film comprising a lower interconnect. On the lower interconnect layer was formed a silicon nitride film, on which was formed a silicon oxide film to about 500 nm. The silicon oxide film was patterned by photolithography and reactive ion etching to form a trench for interconnection and a connection hole with a width of 0.23 $\mu$m to 10 $\mu$m and a depth of 500 nm. Then, a Ta film was formed to 50 nm by sputtering, a copper film was formed to 50 nm by sputtering, and then a copper film was formed to about 800 nm by plating.

CMP Conditions

CMP was conducted using a Speedfam-Ipec Type SH-24 apparatus. The polisher was used, on whose surface plate a polishing pad (Rodel-Nitta IC 1400) was attached. Polishing conditions were as follows: a polishing load (a contact pressure of the polishing pad): 27.6 kPa; a rotating speed of the surface plate: 55 rpm; a carrier rotating speed: 55 rpm; and a polishing slurry feeding rate: 100 mL/min.

Determination of a Polishing Rate

A polishing rate was estimated from surface resistivity values before and after polishing. Four needle electrodes were aligned on a wafer with a given interval. A given current was applied between the outer two probes to detect a potential difference between two inner probes for determining a resistance (R') and further the value is multiplied by a correction factor RFC (Resistivity Correction Factor) to a surface resistivity ($\rho s'$). A surface resistivity ($\rho s$) is determined for a wafer film whose thickness (T) (nm) is known. The surface resistivity is inversely proportional to the thickness. Thus, when a thickness for a surface resistivity of $\rho s'$ is d, an equation:

$$d(nm) = (\rho s \times T)/\rho s'$$

holds true. Using the equation, the thickness d can be determined. Furthermore, a variation between before and after polishing was divided by a polishing time to estimate a polishing rate. A surface resistivity was determined using Four Probe Resistance Detector (Mitsubishi Chemical Industries, Loresta-GP).

Determination of a Dishing Level

Steps were measured by tracing an interconnect-forming area on a polished wafer surface with a stylus. Using HRP-100 (KLA Tencol Inc.) as a step measuring apparatus, scanning was conducted from an area where an interconnect was not formed on an interlayer insulating film, through an interconnect, to the opposite side of the interlayer insulating film.

Determination of an Etching Rate

A Si wafer on which a Cu film had been deposited was cleaved into pieces with the size of 1.2×1.2 cm$^2$, one of which was then immersed in 50 mL of a polishing slurry for 30 min. The Four Probe Resistance Detector was used to measure a Cu film thickness before and after immersion, and an etching rate was determined from a difference in a thickness between before and after immersion and an immersion time.

An etching rate was determined for each of polishing slurries at 25° C. and 60° C., taking into consideration heat generated by friction between the polishing pad and the substrate to be polished during polishing.

Examples 1 to 3 and
Comparative Examples 1 to 10

To a polishing slurry comprising 5 wt % of colloidal silica with an average particle size of 30 nm, 5 wt % of hydrogen peroxide solution (concentration: 30 wt %), 1 wt % of glycine and water were added a benzotriazole and a triazole compounds to the contents shown in Table 1, respectively, to prepare a polishing slurry.

CMP was conducted for a substrate to be polished using each polishing slurry prepared to determine a polishing rate, and an etching rate of each polishing slurry was determined according to the above method. From the results in Table 1, it can be found that a polishing slurry comprising both benzotriazole and triazole compounds provided a polishing rate of about 500 nm/min or more while properly controlling an etching rate which may cause dishing. In Examples, polishing was satisfactorily conducted without vibration or vibration noise generation.

TABLE 1

| | Concentration (wt %) | | | | Polishing rate | Etching rate (nm/min) | |
|---|---|---|---|---|---|---|---|
| | Benzo-triazole | 5-Methyl-1H-benzo-triazole | 1,2,4-Triazole | 3-Amino-1,2,4-triazole | (nm/min) | 25° C. | 60° C. |
| Ex. 1 | 0.01 | — | 0.3 | — | 497 | 1.7 | 17 |
| Ex. 2 | 0.01 | — | — | 0.3 | 565 | 1.9 | 19 |
| Ex. 3 | — | 0.03 | 0.3 | — | 512 | 1.4 | 21 |
| Comp. Ex. 1 | 0.01 | — | — | — | 327 | 3.6 | 24 |
| Comp. Ex. 2 | 0.03 | — | — | — | 87 | 0.3 | 14 |
| Comp. Ex. 3 | — | 0.01 | — | — | 341 | 4.1 | 27 |

TABLE 1-continued

| | Concentration (wt %) | | | | Polishing rate (nm/ min) | Etching rate (nm/min) | |
|---|---|---|---|---|---|---|---|
| | Benzo-triazole | 5-Methyl-1H-benzo-triazole | 1,2,4-Triazole | 3-Amino-1,2,4-triazole | | 25° C. | 60° C. |
| Comp. Ex. 4 | — | 0.03 | — | — | 128 | 1.3 | 18 |
| Comp. Ex. 5 | — | — | 0.1 | — | 628 | 3.5 | 65 |
| Comp. Ex. 6 | — | — | 0.3 | — | 562 | 2.7 | 32 |
| Comp. Ex. 7 | — | — | — | 0.1 | 860 | 4.8 | 100~ |
| Comp. Ex. 8 | — | — | — | 0.3 | 700 | 2.9 | 100~ |
| Comp. Ex. 9 | 0.01 | 0.01 | — | — | 234 | 1.3 | 15 |
| Comp. Ex. 10 | 0.01 | 0.01 | — | — | 125 | 0.8 | 6.5 |

Example 4 and Comparative Examples 11 to 12

To a polishing slurry comprising 5 wt % of θ-alumina, 5 wt % of hydrogen peroxide solution (concentration: 30 wt %), 0.5 wt % of citric acid, 0.3 wt % of glycine and water were added benzotriazole and 1,2,4-triazole to the contents shown in Table 2, respectively, to prepare a polishing slurry.

CMP was conducted for a substrate to be polished using each polishing slurry prepared to determine a polishing rate, an etching rate and a dishing level. From the results in Table 2, it can be found that a polishing slurry comprising both benzotriazole and 1,2,4-triazole provided a polishing rate of about 600 nm/min while a dishing level was substantially reduced in comparison with a slurry comprising benzotriazole or 1,2,4-triazole alone. In Examples, polishing was satisfactorily conducted without vibration or vibration noise generation and damage in an interconnect end or a roughened surface was not observed.

TABLE 2

| | Concentration (wt %) | | Polishing rate (nm/min) | Etching rate at 20° C. (nm/min) | Dishing level (nm) |
|---|---|---|---|---|---|
| | Benzo-triazole | 1,2,4-Triazole | | | |
| Ex. 4 | 0.01 | 0.3 | 580 | 1.6 | 50 |
| Comp. Ex. 11 | 0.01 | — | 320 | 1.3 | 150 |
| Comp. Ex. 12 | — | 0.3 | 640 | 6.5 | 236 |

What is claimed is:

1. A chemical mechanical polishing slurry for polishing a copper-based metal film formed on an insulating film, comprising a polishing material, an oxidizing agent and water as well as a benzotriazole compound and a triazole compound, wherein the mixing ratio of the triazole compound to the benzotriazole compound is 5 to 70.

2. The chemical mechanical polishing slurry as claimed in claim 1 wherein the triazole compound is a 1,2,4-triazole.

3. The chemical mechanical polishing slurry as claimed in claim 1 wherein the total content of the benzotriazole compound and the triazole compound is 0.01 wt % to 1 wt % of the total amount of the chemical mechanical polishing slurry.

4. The chemical mechanical polishing slurry as claimed in claim 3 wherein the polishing material is 5 to 500 nm alumina or silica and is present in an amount of 0.1 to 50 wt %, the oxidizing agent is hydrogen peroxide and is present in an amount of 0.01 to 15 wt % and the slurry has a pH of 3 to 9.

5. The chemical mechanical polishing slurry as claimed in claim 4 wherein the triazole compound is a 1,2,4-triazole.

6. The chemical mechanical polishing slurry as claimed in claim 5 wherein the polishing material has a size of 10–300 nm and is present in an amount of 1–10 wt %, the hydrogen peroxide is present in an amount of 0.05 to 10 wt % and the slurry pH is 4 to 8.

7. The chemical polishing slurry of as claimed in claim 6 in which the hydrogen peroxide amount is 0.1 to 10 wt %.

8. The chemical mechanical polishing slurry as claimed in claim 7 in which the benzotriazole compound is benzotriazole or 5-methyl-1H-benzotriazole and the triazole compound is 1,2,4-triazole or 3-amino-1,2,4-triazole.

* * * * *